(12) United States Patent
Moen et al.

(10) Patent No.: US 9,729,134 B2
(45) Date of Patent: Aug. 8, 2017

(54) SWITCHING DEVICE AND SYSTEM FOR OPERATING AN ELECTRIC LOAD

(75) Inventors: Tor-Eivind Moen, Nesøya (NO); Wojciech Piasecki, Krakow (PL); Knut Rongve, Fyllingsdalen (NO); Jan Wiik, Oslo (NO)

(73) Assignee: ABB SCHWEIZ AG, Baden (CH)

( * ) Notice: Subject to any disclaimer, the term of this patent is extended or adjusted under 35 U.S.C. 154(b) by 323 days.

(21) Appl. No.: 14/424,596

(22) PCT Filed: Aug. 28, 2012

(86) PCT No.: PCT/EP2012/066654
§ 371 (c)(1),
(2), (4) Date: Apr. 24, 2015

(87) PCT Pub. No.: WO2014/032697
PCT Pub. Date: Mar. 6, 2014

(65) Prior Publication Data
US 2015/0263720 A1 Sep. 17, 2015

(51) Int. Cl.
| | |
|---|---|
| *H02J 3/00* | (2006.01) |
| *H02J 1/00* | (2006.01) |
| *H02J 3/14* | (2006.01) |
| *H03K 17/13* | (2006.01) |
| *H01H 9/54* | (2006.01) |
| *H01H 9/56* | (2006.01) |
| *H02P 29/02* | (2016.01) |

(52) U.S. Cl.
CPC .............. *H03K 17/13* (2013.01); *H01H 9/54* (2013.01); *H01H 9/56* (2013.01); *H02J 3/00* (2013.01); *H02P 29/02* (2013.01); *H03K 17/136* (2013.01); *H01H 2009/546* (2013.01); *H03K 2217/0009* (2013.01); *Y10T 307/469* (2015.04); *Y10T 307/76* (2015.04)

(58) Field of Classification Search
USPC ................................ 307/39, 86, 87, 116, 125
See application file for complete search history.

(56) References Cited

U.S. PATENT DOCUMENTS 3,748,492 A * 7/1973 Baker ....................... G05F 1/62
307/117
4,618,906 A 10/1986 Paice et al.
(Continued)

FOREIGN PATENT DOCUMENTS

| EP | 2 058 921 A1 | 5/2009 |
| EP | 2 293 407 A1 | 3/2011 |
| WO | WO 2011/116832 A1 | 9/2011 |

*Primary Examiner* — Adam Houston
(74) *Attorney, Agent, or Firm* — Birch, Stewart, Kolasch & Birch, LLP

(57) ABSTRACT

A switching device is provided for disconnecting or connecting an electric machine, a converter or a plurality of electrical loads supplied with AC power from a power supply and controlled by a control unit. The switching device includes a current sink and at least one mechanical switch in the switching device are arranged in a circuit. The current sink is arranged, upon receipt of a signal, to close and sink the current, and the at least one mechanical switch is arranged to open and break the current on receipt of a signal to open supplied to the electric machine when the current load is at or close to zero. A method and a computer program for carrying out the method are described.

26 Claims, 7 Drawing Sheets

(56) References Cited

U.S. PATENT DOCUMENTS

| | | | |
|---|---|---|---|
| 4,825,330 A | 4/1989 | Walchle | |
| 5,581,433 A | 12/1996 | Jordan | |
| 6,141,193 A | 10/2000 | Mercer | |
| 7,067,940 B2 | 6/2006 | Bianchi | |
| 7,176,589 B2 * | 2/2007 | Rouquette | G01V 1/201 307/17 |
| 7,931,090 B2 * | 4/2011 | Smedstad | E21B 33/0355 166/250.15 |
| 7,986,540 B2 | 7/2011 | Heckenbach | |
| 8,111,502 B2 | 2/2012 | Rocke | |
| 9,214,816 B2 * | 12/2015 | Batho | E21B 41/0007 |
| 9,343,880 B2 * | 5/2016 | Hazel | H02B 7/00 |
| 9,553,522 B2 * | 1/2017 | Boe | H02J 3/22 |
| 2003/0183838 A1 | 10/2003 | Huang et al. | |
| 2004/0222701 A1 * | 11/2004 | Kugelman | H02J 3/14 307/131 |
| 2008/0164961 A1 * | 7/2008 | Premerlani | H01H 1/0036 335/7 |
| 2008/0165457 A1 * | 7/2008 | Premerlani | H01H 59/0009 361/31 |
| 2009/0009931 A1 * | 1/2009 | Rocke | E21B 33/0355 361/602 |
| 2009/0115255 A1 * | 5/2009 | Kumfer | H01H 59/0009 307/113 |
| 2012/0176120 A1 | 7/2012 | Jefferies | |
| 2013/0300491 A1 * | 11/2013 | Boe | H01H 9/548 327/365 |
| 2014/0253032 A1 * | 9/2014 | Bruwer | H02M 1/36 320/108 |
| 2014/0265900 A1 * | 9/2014 | Sadwick | H05B 33/0803 315/200 R |
| 2015/0263720 A1 * | 9/2015 | Moen | H01H 9/54 307/39 |

* cited by examiner

SWITCHING DEVICE AND SYSTEM FOR OPERATING AN ELECTRIC LOAD

TECHNICAL FIELD

The present invention is concerned with a switching device for operating an electrical load or machine which is supplied with AC power. The switching device is arranged to switch off or switch on AC power to the electrical load or machine in a no-current or near no-current state. It is particular advantageous when used to control or protect a subsea electrical load or machine in an installation for production, distribution and/or processing in the industry of Oil and Gas.

TECHNICAL BACKGROUND

Subsea power distribution is currently under development, where also switchgear is seen as an important component to realize reliable operations. A circuit breaker for an AC power supply is often constructed as a vacuum circuit breaker or a gas-filled circuit breaker to control or eliminate the electric arc that usually occurs when breaking a large electric current. However, such circuit breakers, when connected in circuits including a voltage source converter (such as for operation of electric motors) require additional overvoltage protection equipment for the converter. This normally requires a chopper and a bypass.

In some DC power systems it has been known to use no-load switching devices. In U.S. Pat. No. 7,067,940, entitled "Submarine branching unit having asymmetrical architecture" and assigned to Pirelli, a submarine branching unit of a submarine optical cable system is described. Relays are used to configure and switch DC power flowing in different cables. The relays are arranged to switch current at zero current conditions. EP2293407, entitled "Power transmission and distribution systems" and assigned to Converteam Technologies describes a subsea DC power and transmission distribution system which includes DC/DC converter units that can be switched at no-current or at zero voltage.

One application for a circuit breaker in which a vacuum based design creates difficulties is in a subsea application. Apart from the sealing issues to prevent penetration of sea water, there arises the issue of increased ambient pressure at significant depths under the surface of the sea. Thus a subsea implementation of switchgear can be found where a thick tank is constructed to keep a close-to 1 atm (atmosphere) pressure inside the vessel in which a normal off-the-shelf circuit breaking chamber is installed. For example, in U.S. Pat. No. 8,111,502, entitled "Arrangement adapted for a subsea application", and assigned to Vetco Gray Scandinavia AS, an arrangement for AC electric power distribution is described which is enclosed in such a watertight casing. The arrangement uses an AC voltage regulator to reduce a voltage to a No-load level during switching by using a magnetic flux adaption method.

For greater depths, such a construction becomes extremely heavy and inconvenient. At a depth of 3000 meters the pressure on any enclosure is around 300 atm which requires a very heavy enclosure to resist the pressure difference between a 300 atmospheres external pressure and a 1 atm internal pressure. A subsea application also means that reliability of the circuit breaker is crucial and that on-site maintenance or repair brings with it unacceptably high additional cost and difficulties.

SUMMARY OF THE INVENTION

The aim of the present invention is to remedy one or more of the above mentioned problems with an improved switching device. Advantageous embodiments are described in sub-claims to the independent claims.

According to a first aspect of the invention, a switching device is arranged for disconnecting at least one electrical power load comprising any of: a group of electrical power loads; a converter; or an electric machine supplied with AC power from a power supply and controlled by a control unit, wherein a current sink and at least one mechanical switch in the switching device are arranged in a circuit between the power supply and at least one said electrical load, the current sink is arranged, upon receipt of a signal to close and sink the current, and that the at least one mechanical switch is arranged, on receipt of a signal, to open and disconnect the at least one said electrical load or electric machine when the current load is at or close to zero.

According to an embodiment of the invention, a switching device is disclosed for disconnecting at least one electrical power load comprising any of: a group of electrical power loads; a converter; or an electric machine supplied with AC power from a potential source of fault current and controlled by a control unit, wherein a current sink and at least one mechanical switch in the switching device are arranged in a circuit between the power supply and at least one said electrical load, the current sink is arranged, upon receipt of a signal to close and sink the current, and that the at least one mechanical switch is arranged, on receipt of a signal, to open and disconnect the at least one said electrical load or electric machine when the current load is at or close to zero.

According to an embodiment of the invention, a switching device is disclosed for disconnecting at least one electrical power load supplied with power from an AC power supply and controlled by a control unit, wherein a current sink and at least one mechanical switch in the switching device are arranged in a circuit between the power supply and at least one said electrical load, wherein the current sink comprises any device from the group of: thyristor-based crowbar; diode bridge; diode bridge with active switch. A thyristor based device may advantageously be used as a current sink. There are various ways to implement the current sink arrangement. Using anti-parallel thyristors have a controllable turn-on, by applying gate current and at the same time having a positive forward voltage, and may thus be switched on in an extremely short time.

According to another embodiment of the invention, a switching device is disclosed for disconnecting at least one electrical power load supplied with power from an AC power supply and controlled by a control unit, wherein the current sink comprises at least one circuit comprising thyristors arranged with a ground point connection to a neutral point connection. An advantage of the embodiment is that in the case of an unbalanced supply including a zero sequence component, shorting all phases into the current sink also removes any zero sequence component.

According to another embodiment of the invention, a switching device is disclosed for disconnecting at least one electrical power load supplied with power from an AC power supply and controlled by a control unit, wherein the current sink is arranged connected closer to a potential source of fault current than the no-load switch. Thus in the case where a fault arises in a converter supplying a load such as a motor, the motor has the potential to be the source of a fault current. If the motor is still magnetised and rotating when a fault develops in the converter, then the motor can become a generator and feed a fault current that flows into the converter that has the fault. The positioning of the current sink adjacent in the circuit to a potential source of fault current overcomes this source of fault currents and protects eg the converter.

According to another embodiment of the invention, a switching device is disclosed for disconnecting at least one electrical power load supplied with power from an AC power supply and controlled by a control unit, wherein the current sink unit is connected to more than one mechanical switch.

According to another embodiment of the invention, a switching device is disclosed for disconnecting at least one electrical power load supplied with power from an AC power supply and controlled by a control unit, wherein the current sink and at least one mechanical switch in a switching device are arranged connected between a voltage source converter and at least one said electrical power load or electric machine.

According to another embodiment of the invention, a switching device is disclosed for disconnecting at least one electrical power load supplied with power from an AC power supply and controlled by a control unit, wherein at least one impedance device is arranged between the power supply and the switching device.

According to another, further embodiment of the invention, a switching device is disclosed for disconnecting at least one electrical power load supplied with power from an AC power supply and controlled by a control unit, wherein the control unit comprises a processor and a computer program adapted for sending out, upon receipt of a fault current signal, a signal to carry out a protection action. The control unit may be arranged to carry out more than one protection action or combinations of protection actions.

According to another embodiment of the invention, a switching device is disclosed for disconnecting at least one electrical power load supplied with power from an AC power supply and controlled by a control unit, wherein the control unit comprises one or more circuits arranged, upon receipt of a detection of a fault current, to generate a signal for a protection action.

According to another embodiment of the invention, a switching device is disclosed for disconnecting at least one electrical power load supplied with power from an AC power supply and controlled by a control unit, wherein the switching device comprises one or more circuits, or a control unit, arranged, upon detection of an over-voltage, to automatically generate a signal for a protection action against the over-voltage which comprises any of: sending a close signal to the current sink; sending an open signal to at least one mechanical switch.

According to another embodiment of the invention, a switching device is disclosed for disconnecting at least one electrical power load supplied with power from an AC power supply and controlled by a control unit, wherein the at least one mechanical switch is arranged, on receipt of a signal, to open and disconnect the at least one said electrical load or electric machine in the shortest possible time during which a fault current may flow. A control unit may be arranged to select, from a plurality of control or protections actions, a control or protection action that shall result in the shortest time during which a fault current can flow into a converter or other load electrical load.

According to another, further embodiment of the invention, a switching device is disclosed for disconnecting at least one electrical power load supplied with power from an AC power supply and controlled by a control unit, wherein the current sink is arranged connectable to one or more DC-capacitors such that, on connection of the mechanical switch and the load, the DC-capacitors are charged by the current sink for a part of the time that the current sink is closed.

The challenge of using the simple pressure tolerant switching device is two-fold. First, to avoid breaking a large current in the switching device. Breaking a large or heavy current in the breaker device results in electrical arcs which lead to burning of the contact faces and debris, or contamination of any insulating oil surrounding the breaker device. With repeated arcing the contact faces deteriorate and the insulating properties of the oil are reduced by the burning and contamination so that the service life is reduced and the breaker device will fail. Secondly, quick-acting protection of sensitive loads such as voltage source converters is preferred in order to reduce damage to the converters due to a fault and in particular to an over-voltage.

During development for a subsea Oil and Gas project in the North Sea off the coast of Norway the inventors have developed a solution to the above problems. The switching device according to the first aspect of the invention comprises a current sink and a mechanical switch. It enables the use of a simple and robust pressure tolerant breaking device, the mechanical switch, which may also be described as a no-load breaker or a disconnect switch. This type of device is a readily available and well-tested component, which thus avoids the considerable amount of time and great expense otherwise required to develop a new switch device. It is also available in different dimensions to suit many different applications and service requirements.

The switching device is a fast-acting system, which enables a fast reduction of fault current or load over-voltage, which in turn minimizes damage arising due to an electrical fault, and the amount of energy going into a fault When protecting a converter or a load against over-current or over voltage due to a fault condition in, for example, some part of the load such as a motor or a converter, then it may be necessary to open the mechanical switch as quickly as possible. This is in order to minimise damage from a fault current or over voltage from a current source such as the AC power supply that flows into a load or converter and causes damage. Additionally, it is critical to isolate faulty loads such that normal operation can resume at healthy loads. The switching device comprises simple components, the mechanical switch and the current sink. It may be used for switching on or switching off an electrical power load in a no-load or near no-load state; preferably during a normal disconnect the mechanical switch may be at no-load or close to no-load. It is a simpler system. Using the switching device removes the need for a circuit breaker (which is difficult to make pressure tolerant). By eliminating the circuit breaker the switching device also removes the need for additional over-voltage protection equipment (chopper +bypass) for any voltage source converters in the circuit.

According to another aspect of the invention, a method is disclosed for disconnecting an electrical power load comprising any of: a group of electrical power loads, a converter or an electric machine supplied with AC power from a power supply and controlled by a control unit using at least one switching device, the method comprising switching, upon receipt of a signal, the current sink to close and sink the current, signalling at least one mechanical switch to open, which mechanical switch together with the current sink is arranged in a circuit between the power supply and the electrical power load, and switching off the current sink when the mechanical switch has opened so that the mechanical switch has switched to disconnect the at least one said electrical load or electric machine when the current load is at or close to zero.

According to another aspect of the present invention, there is provided a computer program product comprising computer-executable components recorded thereon for causing a control unit to perform an embodiment of a disconnect method of the present invention when the computer-executable components are run on a processor comprised in the control unit.

According to another aspect of the present invention, there is provided a computer program comprising computer program code which is able to, when run on a processor of a control unit, cause the control unit to: switch, upon receipt of a signal, a current sink to close and sink the current; signal at least one mechanical switch to open, which mechanical switch together with the current sink is arranged in a circuit between an electrical power supply and an electrical power load comprising any of: a plurality of electrical power loads, a converter, or an electrical machine; and switch off the current sink when the mechanical switch has opened so that the mechanical switch has switched to open the circuit supplied to the electrical load or electric machine when the current load is at or close to zero.

According to another aspect of the invention, a distribution system supplying AC power from a power supply to an electrical power load comprising any of: a plurality of electrical power loads; a converter; or an electric machine and controlled by at least one control unit is disclosed, the system including a switching device for disconnecting at least one electrical power load or at least one electric machine supplied with AC power from a power supply, wherein at least one mechanical switch and a current sink in the switching device are arranged connected in a circuit between the power supply and the electrical power load or electrical machine, the current sink is arranged, upon receipt of a signal to close and sink the current, and that the mechanical switch is arranged to open and break the current on receipt of a signal to open supplied to the mechanical switch when the current load is at or close to zero.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. The use of "first", "second" etc. for different features/components of the present disclosure are only intended to distinguish the features/components from other similar features/components and not to impart any order or hierarchy to the features/components.

BRIEF DESCRIPTION OF THE DRAWINGS

A more complete understanding of the method and system of the present invention may be had by reference to the following detailed description when taken in conjunction with the accompanying drawings wherein.

DESCRIPTION OF THE PREFERRED EMBODIMENTS

Figure 1:
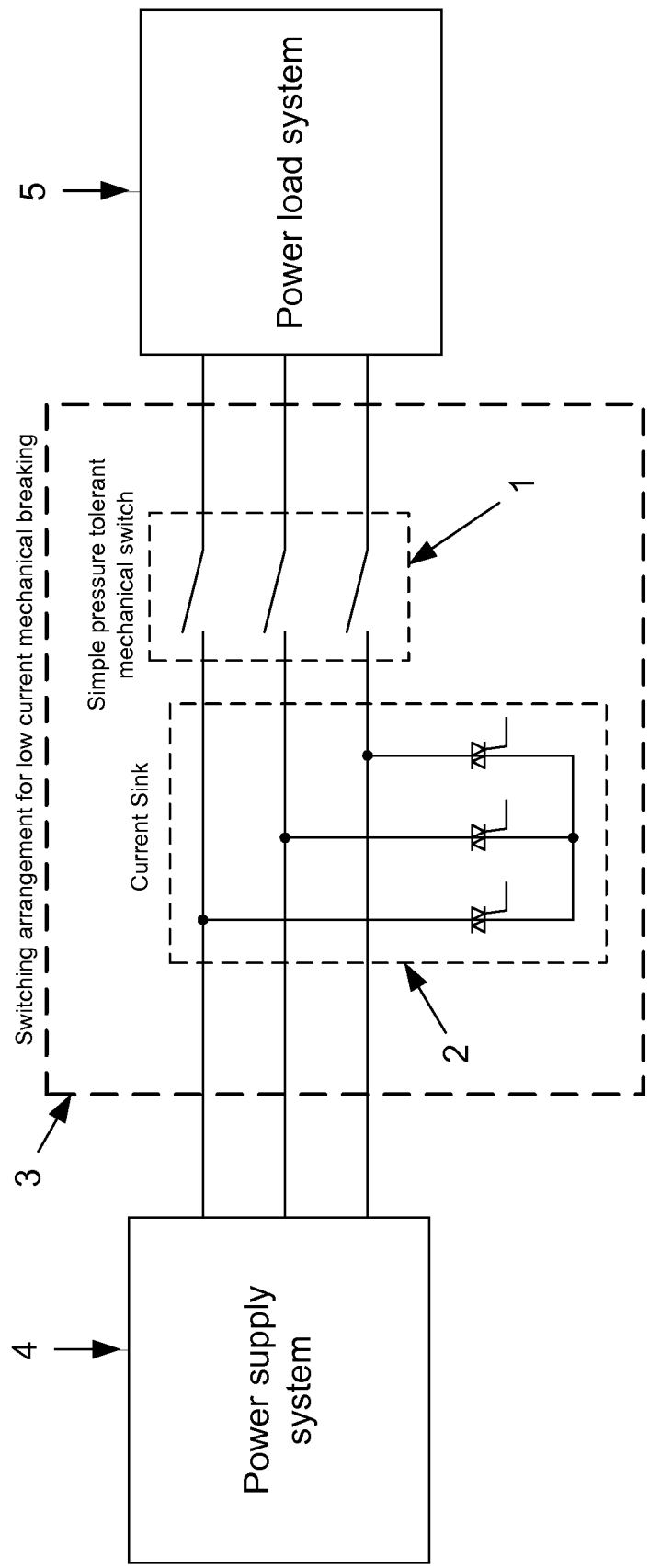
FIG. 1 shows a schematic diagram of an arrangement including a switching device according to a first aspect of the invention.

FIG. 1 shows a schematic diagram for a switching device in a circuit arrangement. The figure shows a multiphase power supply system 4 connected to power load system 5. The electrical power load system 5 comprises one or more electrical power loads, and may comprise one or more converters and one or more electrical machines including for example, a machine such as an induction motor. Three phases are indicated in the diagram, but the invention is not limited to 3 phase applications, and may be applied to power supply systems with less than, or more than 3phases. The power supply system can be described to be topside, and it may be located onshore or may be located on a fixed or floating platform. The power load system 5 is located under the surface of the sea and may be described as the subsea side, and may be mounted on the seabed. The diagram shows a switching device 3, indicated surrounded by a large box with dashed (---) lines, is arranged between the power supply 4 and the electrical power load 5. The switching device 3 comprises a current sink 2 and a mechanical switch 1, each one being indicated by a separate box with dashed lines. The mechanical switch may be a simple, pressure-tolerant mechanical switch. It may be used for switching on or switching off an electrical power load in a no-load or near no-load state. The mechanical switch may also be known as a no-load breaker, a compact off-load switch, or a disconnect switch. The current sink 2 is shown to comprise thyristors arranged on each of the three phases shown in the diagram.

Figure 2:
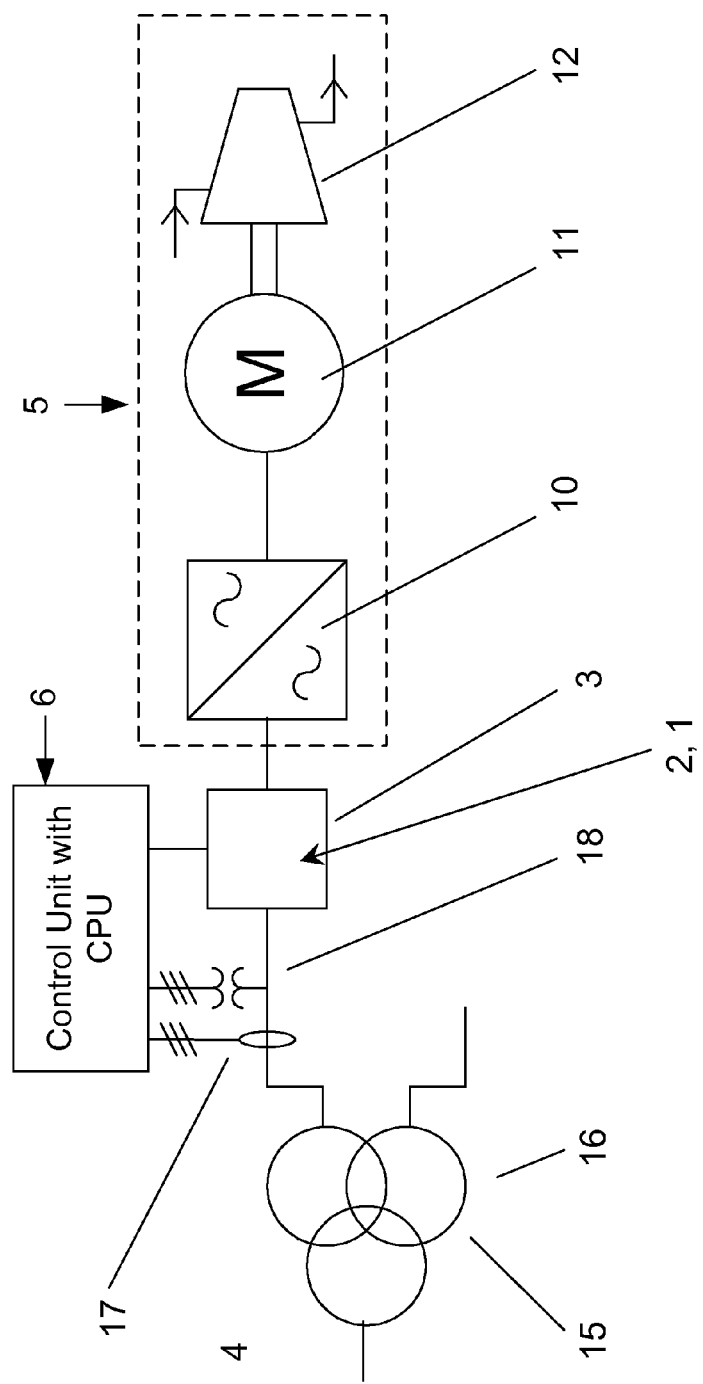
FIG. 2 is a schematic diagram for a circuit using the invention of FIG. 1 according to an embodiment.

FIG. 2 shows a schematic diagram for a circuit using the switching device. The figure shows the power supply 4 comprising a transformer 15. A protection relay or control unit 6 is shown which is arranged connected to sensors for electrical properties such as current 17 and voltage 18. The switching device is schematically shown connected between the power supply and the electrical power load 5. Thus for the example if a converter develops a fault, it needs to be isolated quickly from any potential source of fault current, which in the example of FIG. 2 would be the AC power supply 4. The switching device 3 comprises a current sink 2 and a no-load switch 1 (not shown in this diagram) and the current sink is placed connected closest in the circuit to the potential source of fault current, in this case the AC power supply 4. In this way the converter, in this example, may be protected against an over current or over voltage that flows into the converter from the power supply 4 during a fault condition for more than a very short period of time. This short period of fault current time $t_{fc}$ from the occurrence of a fault (40) to the switching off (44, 44') or isolation of a fault current source such as AC power supply 4, the time during which a fault current may flow, is measured in milliseconds. The power load 5 in the example of FIG. 2 is shown to comprise a drive or other power controlling device, for example in the form of a voltage source converter 10. Power load 5 also comprises an electrical load, which may be any of a converter and/or motor 11, and in this case, also comprises a mechanical load in the form of a compressor 12.

The switching device 3 includes a current sink 2 arrangement to divert current while, during the short time period the current sink is closed, being able to use a no-load or disconnect switch to open or break a circuit supplying, for example, an electric machine 11 or electrical load. The mechanical switch is a simple, pressure-tolerant breaking device. The current sink 2 may be implemented with a thyristor-based crowbar device. The switching device may be operated in the following way;

1. An abnormal or faulty condition, which may be detected in the power load system (5) or power supply system 4; is also detected in control unit 6 which processes the signal as a fault and generates a signal to be sent to the current sink 2;
2. A signal is sent to the power current sink 2/crow bar unit to close and to thus make a short-circuit;
3. (a) In case of a load fault, the current from the power supply 4 that was feeding into the fault in the power load system is now removed and directed into the temporary three-phase fault generated by the current sink 2. As a result, both the current going through the mechanical switch as well as the power being fed into the fault are reduced to zero;
3. (b) In case of an over-voltage, the voltage supplied to the power load system (5) is now reduced to zero and the effect of the over-voltage can be removed due to quick control action;
4. An open signal is sent to the mechanical switch (1) that opens and breaks the circuit under a no-load (or close to no-load) condition;
5. After the mechanical switch is open, the short generated by the crow bar is removed by removing the gate signals to the thyristors. The thyristors must be rated to withstand the I^2 integral requirement (the value of the current I indexed to the power of 2) while still having enough voltage blocking capability.
6. The load system with the fault is now disconnected.

Figure 4:
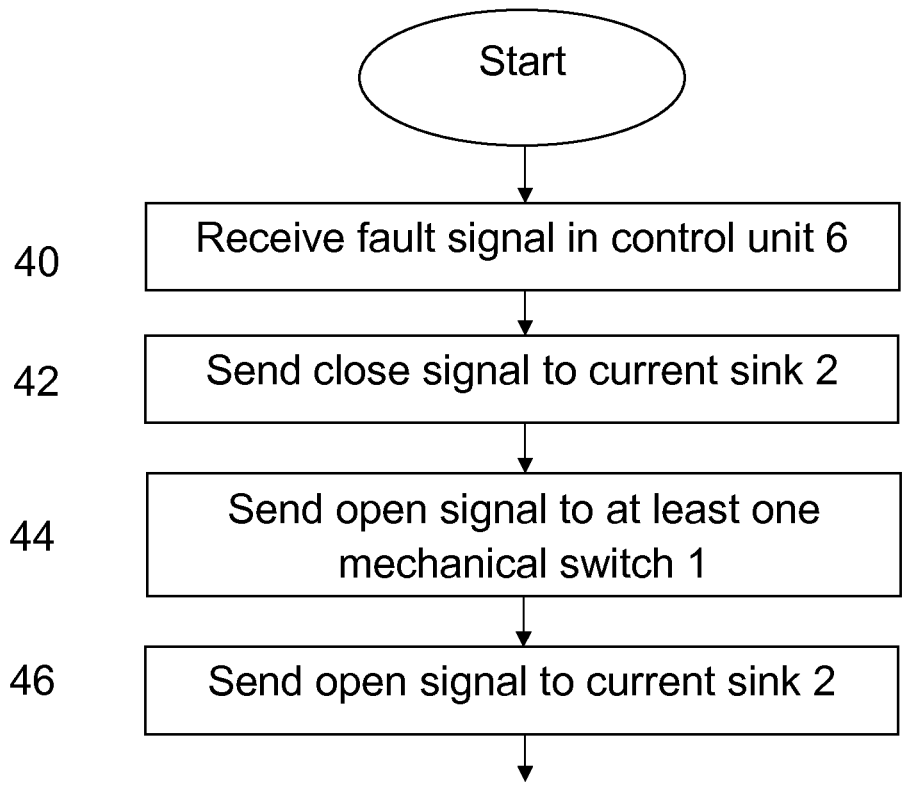
FIG. 4 is a flowchart for a method for operating the invention of FIG. 1 according to a second aspect of the invention.

A protection relay or a control unit 6 (shown in FIGS. 2, 6) may be arranged to ensure that the above procedure is carried out. The flowchart of FIG. 4 summarises this. The method as shown in FIG. 4 comprises the steps of:
40 receive fault signal in control unit 6;
42 Send Close signal to current sink 2;
44 Send Open signal to at least one mechanical switch 1;
46 Send Open signal to current sink 2.

Control unit 6 may be a control and protection unit, which may include one or more relays. One of more of the above steps may be carried out by another unit. The other unit may comprise a circuit with an analogue part, such as a circuit including a relay. A circuit involving a digital process may also be used to provide the logic and the in/out signals to carry out the above method.

Figure 3:
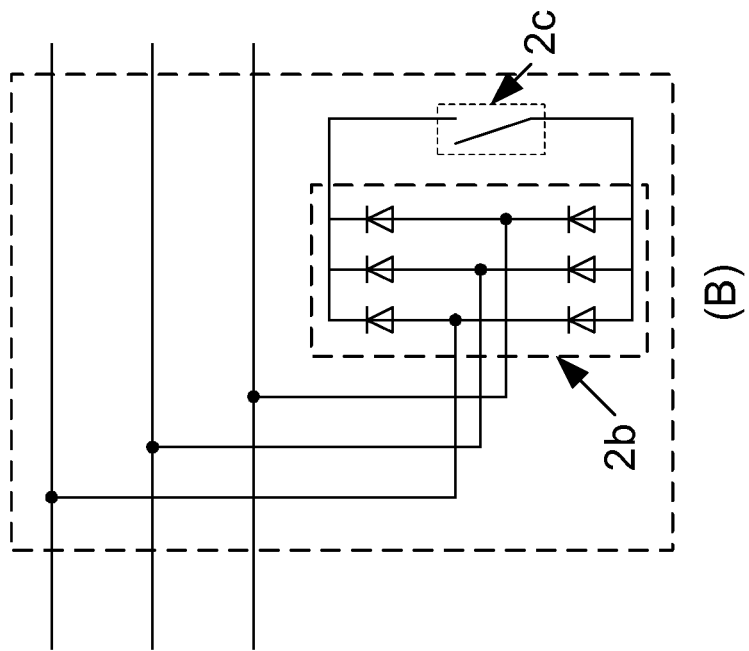
FIG. 3a-d is another schematic circuit for a circuit using the invention of FIG. 1, showing in particular optional variants for the current sink according to four embodiments.
Figure 3:
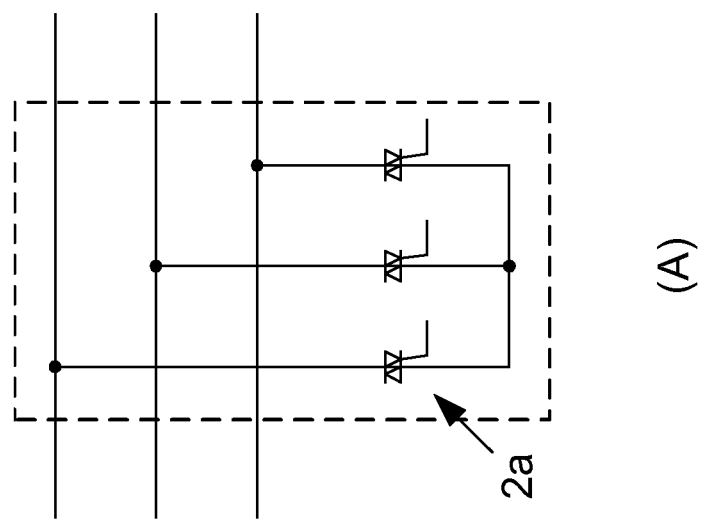
Figure 3:
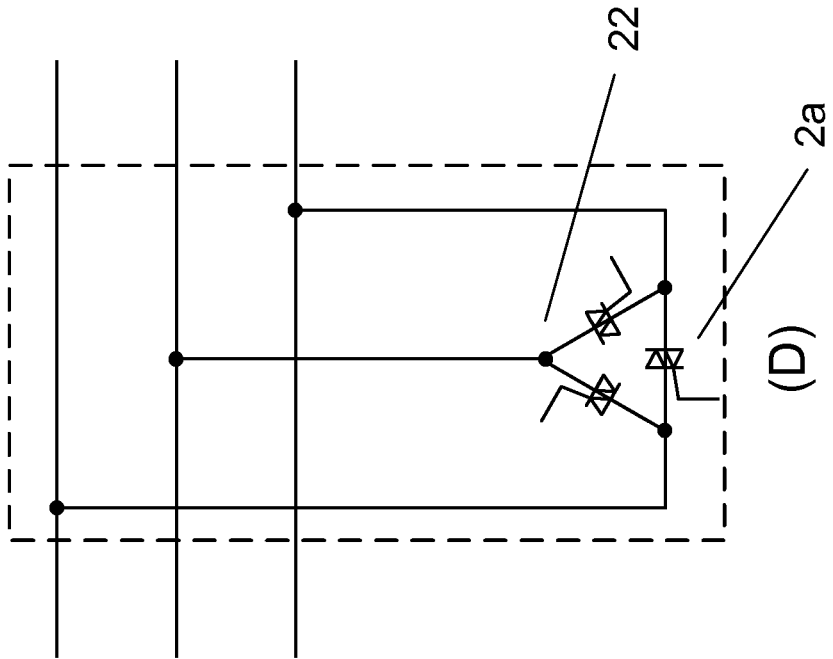
Figure 3:
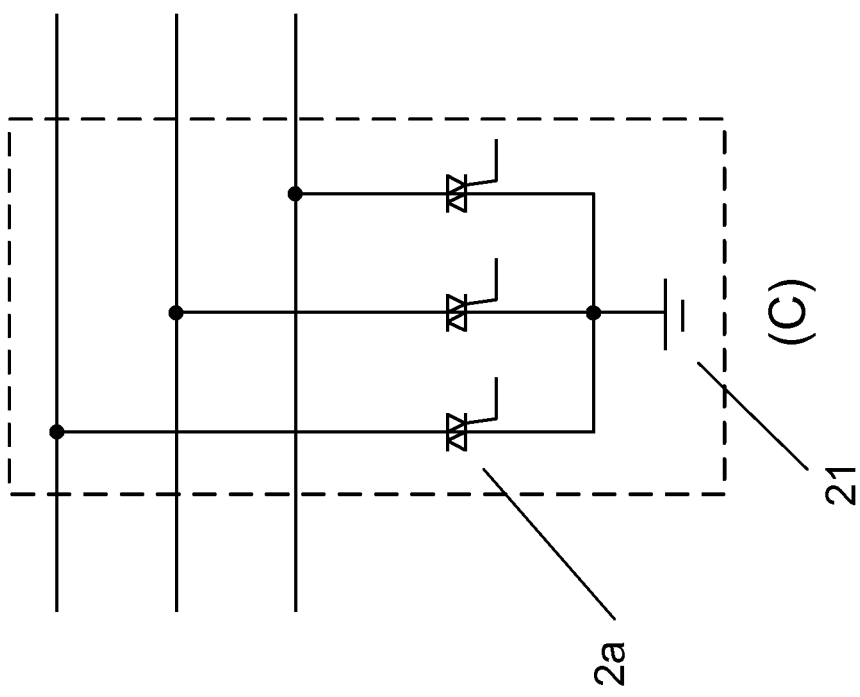

A thyristor based device has been described above as a current sink. There are various ways to implement the current sink arrangement, and two options are illustrated in FIG. 3(*a*), 3(*b*). Option A in FIG. 3(*a*) is based on using anti-parallel thyristors. Thyristors have the capability of having a controllable turn-on, by applying gate current and at the same time having a positive forward voltage. However, for turn-off, the external circuit must force the current to zero. In the arrangement shown, such forcing of current to zero will occur due to the alternating currents. Thus using forced AC currents the thyristors will be turned off within one half-cycle after removal of turn-on signal, which, for an AC frequency of eg 60 Hz, would be within approximately 8 milliseconds.

Another current sink arrangement is illustrated in FIG. 3(*b*). Here, a diode bridge 2*b* is used to first create a dc-voltage, where the dc-terminals can be shorted by using an active switch with turn-off capability 2*c*. Such an active switch can e.g. be implemented by typical semiconductor technology such as IGBTs (Insulated Gate Bipolar Transistor) or IGCTs (Integrated Gate-Commutated Thyristor). Yet another current sink arrangement is illustrated in FIG. 3(*d*). In this circuit the thyristors are arranged in a delta connection. The diagram shows the star point of the thyristors 22 connected to the neutral line of the power supply.

When the current sink is closed, ie turned-on, a significant disturbance will be seen in the system and it is advantageous to identify opportunities to reduce the on-time of the current sink. This consideration is addressed to some extent by using forced alternating current to force the gate turn-off of the thyristors which limits the on-time after an off signal is generated to a maximum of one half cycle, eg 8 msec.

According to another embodiment the current sink on-time may also be reduced by sending the Open command to the no-load breaker (mechanical switch 1) before turning on the current sink. After the mechanical switch turn-on signal is sent, the mechanical switch starts to open, but the time taken to open a mechanical switch is not negligible. After the Open command is sent to the mechanical switch, preferably directly after, the Close command is sent to the current sink, to switch it on. The time delay between signalling the electronic devices (thyristors) to switch on and the flowing of current into the current sink is, by comparison, a much shorter time, of the order of microseconds, ps. In this way a shorter close time is applied to the current sink, a time which is sufficient to make sure that the arc in mechanical switch is stopped (or else does not occur). When the current sink is closed for a shorter time, then the impact of the short circuit due to the current sink on the remainder of loads connected to the power supply, is reduced.

Figure 5:
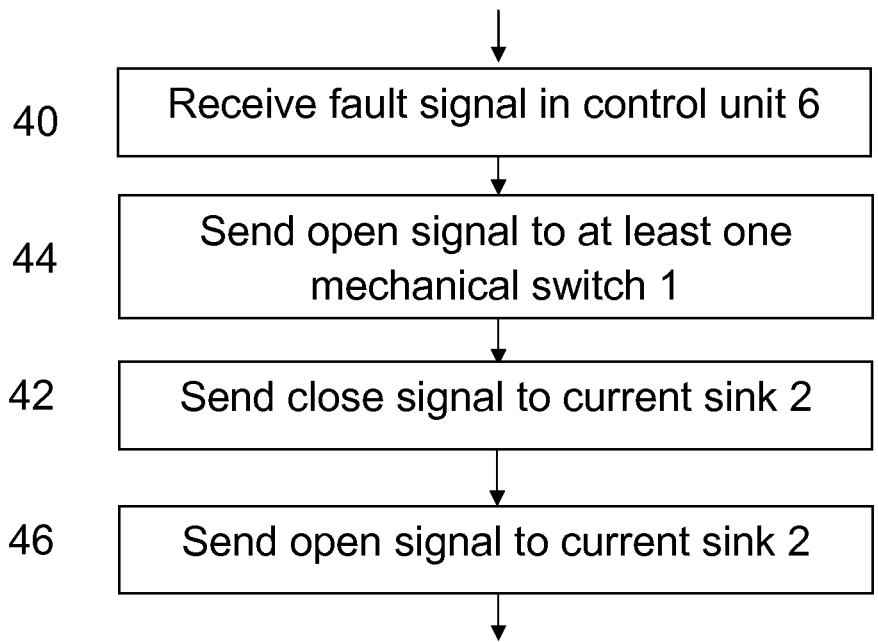
FIG. 5 is a flowchart for a method for operating the invention of FIG. 1 and in particular carrying out the steps in a different order according to another embodiment.

The flowchart of FIG. 5 summarises the method of switching of the current sink after signalling to the mechanical switch. The method as shown in FIG. 5 comprises the steps of:
40. Receive fault signal in control unit 6;
52. Send Open signal to at least one mechanical switch 1;
54. Send Close signal to current sink 2;
56. Send Open signal to current sink 2.

When the mechanical switch is signalled first after a fault has been detected and before the current sink is closed (switched on) then the length of time that the current sink is operated (closed) is reduced. While the current sink is closed the fault current flowing into it may cause some of the main components in the power load 5 to experience a voltage dip while the current sink is closed. This means, as noted above, that with a shorter time during which the current sink is connected, the voltage dip created by the activation of the current sink is experienced by other loads in the same power system for a shorter time.

As also noted in relation to the FIG. 4 flowchart above, the one or more of the above steps of FIG. 5 may be carried out by a unit other than the control unit 6, which may be a separate unit or circuit with an analogue part, such as a circuit including a relay.

The time period after which the current sink is opened, the current sink on-time, may be determined in a number of ways. In the method of FIG. 4 it is the time between steps 42 and 46, but in the method shown in FIG. 5 it is the time between steps 54 and 56. The current sink on-time may be determined by calculating a time period following a signal that the mechanical switch is open. It may be determined based on an estimated time for the length of time required for the mechanical switch to open after it has received a signal to open. It may be determined based on an estimate for the length of time required for the mechanical switch to open sufficiently to avoid potential breakdown across the gap between the open contacts.

FIG. 3(c) shows an arrangement for a current sink in another embodiment. This is similar to the arrangement of FIG. 3(a). The figure shows thyristors similar to 2a of FIG. 3(a) except that they are arranged with a ground point 21 connection to a neutral point connection. In case of an unbalanced supply (including a zero sequence component), shorting all phases into the current sink will not remove the zero sequence component, and this current component might still flow into the load. Therefore, as an additional measure, the star point of the thyristor arrangement can be connected to the neutral point/ground.

Figure 6:
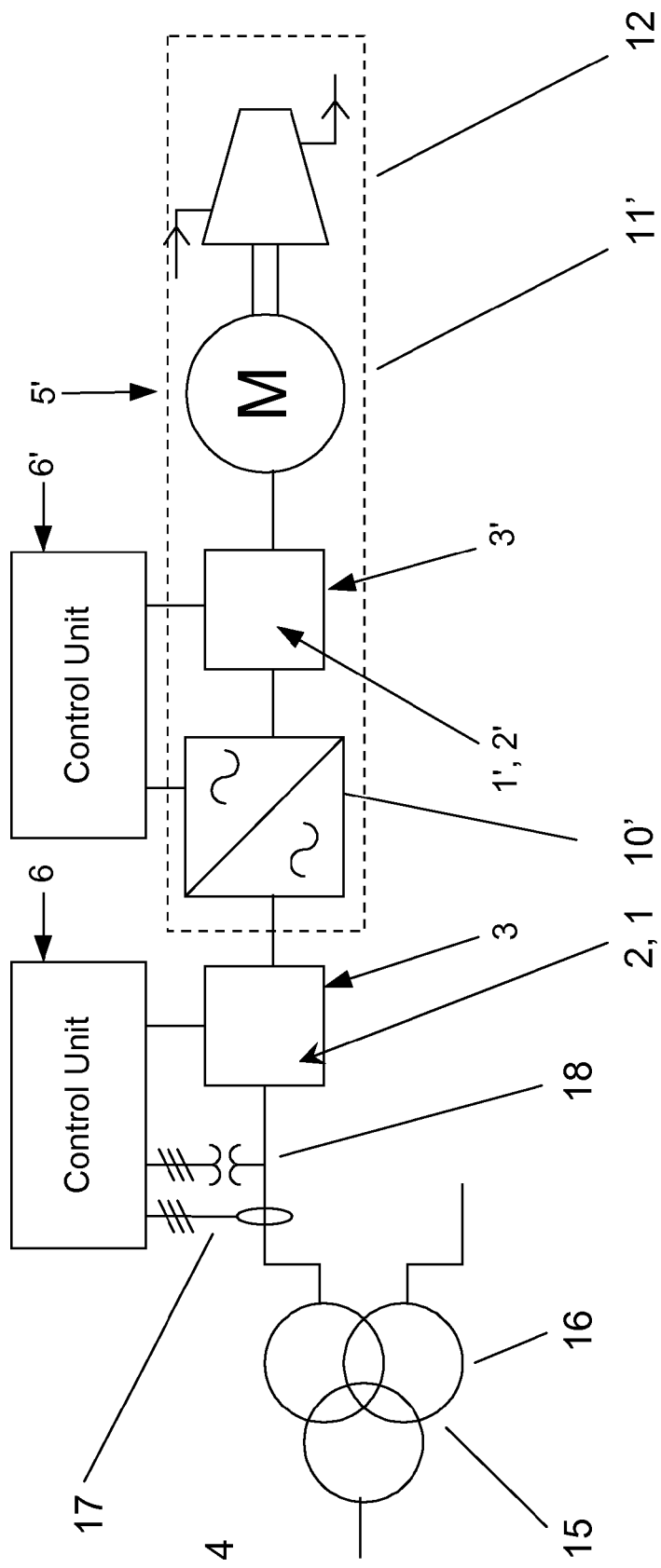
FIG. 6 is a schematic diagram for a circuit using the invention of FIG. 1 and in particular where the switching device is connected between a converter and a load or a motor, according to another embodiment.

FIG. 6 shows a variation of the circuit of FIG. 2. The diagram is similar to FIG. 2. It also shows a second switching device 3' which includes a current sink 2' and a no-load switch 1' (not shown in diagram) but the second switching device 3' is installed connected between a converter 10' and an electrical power load such as, in the example shown, an electric motor 11'. In this embodiment the current sink is placed closest connected to the motor and the mechanical switch is connected closest to the converter. The switching device is used to switch off and isolate the motor in case of a fault. For example, if a fault arises in the converter 10'. In this circuit arrangement the motor 11', while magnetised and rotating, becomes the source of a fault current or over voltage in the event that the converter develops a fault. The motor, if magenetised and rotating, can become a generator and feed a fault current that flows into the converter 10' that has the fault. In the circuit of FIG. 6 the converter is thus protected by the current sink 2' from a potential fault current source that can arise in the motor 11'.

Also a single electric load, in this case the electric motor 11' may be switched on or off as required by the second switching device 3' independently of another switching device such as the switching device 3 which is also supplied from the same power supply 4.

Figure 7:
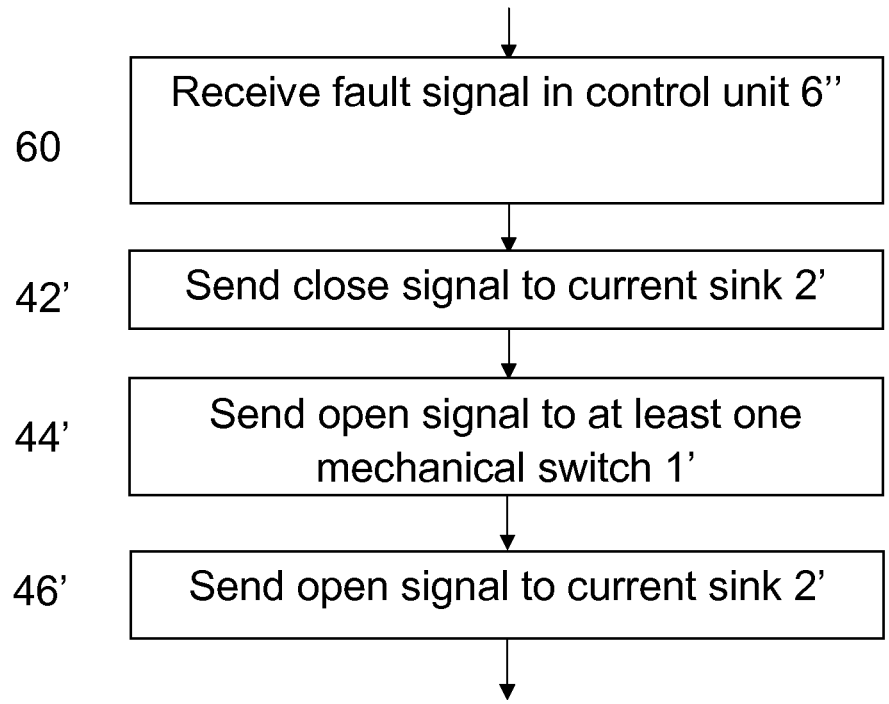
FIG. 7 is a flowchart for a method of operating the invention of FIG. 1 according to the embodiment of FIG. 6.

FIG. 7 is a flowchart for a method where the protection relay or a control unit 6' (see FIG. 6) may be arranged to carry out a protected switch-off of motor 11' to protect the converter 10' from a fault condition of eg the converter 10' where an over voltage or over current may be generated by the motor 11', a fault current in other words, which could flow into the fault in the converter if the motor 11' is not isolated quickly. The amount of time that such a fault current flows, time $t_{fc}$, is minimised by using the switching device to isolate the converter or other load from a potential fault current source. The method as shown in FIG. 7 comprises the steps of:

60 Receive fault condition signal in control unit 6';
42' Send Close signal to current sink 2';
44' Send Open signal to at least one mechanical switch 1';
46' Send Open signal to current sink 2'.

The order of steps 42', 44' may be changed in a similar way as for the method described in relation to FIG. 5 to optimise or shorten the length of time that the current sink 2' is closed. Thus the converter 10' is protected in the event that the motor becomes the source of a fault current or over voltage. If the power supply to the motor is changed rapidly, in a worst case with the motor rotating in a still magnetised field, a substantial over voltage or fault current may be generated that would flow into the converter and damage it. Switching on 42' the current sink 2' sinks any current or voltage between the converter 10' and the motor 11'. After the current sink has been connected the motor 11' is isolated by being switched 44' to OFF by the mechanical switch 1' in a no-load state. After that point, the current sink 2' is disconnected 46' Thus in this embodiment the electrical load was switched OFF when the mechanical switch 1' was in a no-load state. The length of time that any fault current ($t_{fc}$) flows into eg the converter has also been minimised.

It is an advantage to have an impedance between the switching device 3 and the grid and/or other loads. Without any impedance there will be a voltage dip, possibly a severe one, which will be experienced by the other loads during the time in which the fault current is discharged to the current sink (ie, the current sink on-time). The power supply system 4 may include, as shown in FIG. 2, a transformer 15. The transformer is normally also an inductor and when the transformer is connected between the grid and the load with the fault then the transformer impedance will reduce the magnitude of fluctuations in voltage during the time the current sink is closed. Optionally, the transformer may be specified to have a known or minimum inductance 16 to reduce the expected voltage fluctuations. For example the transformer may be specified to provide an impedance value which is sufficient to meet an impedance requirement before the input stage of any voltage source converters that is/are connected after the transformer.

In an advantageous embodiment one or more switching devices are arranged in a distribution system supplying AC power from a power supply 4 to a plurality of electric power loads 5 or electric machines 10. The distribution system may comprise at least one switching device controlled by a control unit 6 for disconnecting at least one of the plurality of electrical loads 5 or electric machines 10. At least one current sink is arranged nearest a power supply 4, as shown in FIG. 2, and other switching devices may be arranged in the circuit and connected such that a current sink is arranged connected closest to a motor or other load as in the embodiment of FIG. 6. More than one control unit 6 may be arranged in the distribution system.

In another embodiment the voltage rise at connection of the mechanical switch may be controlled by the switching device. In particular, one of more DC capacitors are connected to the current sink and arranged to be charged by the current sink for a specific time period during and after the mechanical switch connects the electric machine or load 5. For example, by controlling the closed timing to be only part of a half cycle, the applied voltage to the load, and in particular to a voltage source converter 10 forming part of the load, can be slowly increased. The rate of increase is balanced to avoid an unnecessary large rating for the current sink thyristors. This has the advantage of reducing or eliminating the requirement for a pre-charging circuit for each voltage source converter.

In another embodiment the switching device may comprise more than one mechanical switch 1. If, for example, a fault is detected on one electric machine, then the combination of the one current sink and one mechanical switch connecting the one affected electric machine or load may be disconnected using the current sinking and current breaking methods described above and in relation to FIG. 4, 5 or 7. Thus one single current sink 2 may be used to connect a plurality of electric machines or other electrical loads 5 to the power supply 4. This means that any of the switching methods described may be used together with one current sink and a plurality of different mechanical switches to disconnect more than one electrical load 5 or electrical machine 10. The multiple disconnects may occur simultaneously or one at a time, in any order, depending on the nature or extent of any present fault or on other reasons. Thus, after the current sink has closed to sink the current, a first mechanical switch may be opened to disconnect one load, and then a second mechanical switch of the same type may be opened to disconnect another load also connected through the same current sink.

Figure 8:
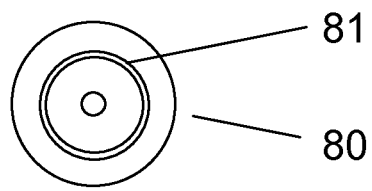
FIG. 8 schematically shows a data carrier with computer program code recorded on it for performing the steps of a method according to any of FIG. 4, 5 or 7 according to another aspect of the invention.

The methods of the invention such as those method steps shown in FIG. 4, 5 or 7 may, as previously described, be carried out by means of one or more computer programs comprising computer program code or software portions running on a computer or a processor. Such a processor may be arranged with a memory storage unit of a process system control unit, control unit, relay based control and protection unit, programmable control unit (PLC), motor control unit, or other motor control system part thereof. A part of the program or software carrying out the methods may be stored in a processor as above, but also in a ROM, RAM, PROM, EPROM or EEPROM chip or similar memory means. The program in part or in whole may also be stored on, or in, other suitable computer readable medium such as a magnetic disk, magneto-optical memory storage means, in volatile memory, in flash memory, as firmware, stored on a data server or on one or more arrays of data servers or even on removable memory media such as flash memories, hard drives etc. This computer program code may also be provided on one or more data carriers or non-transitory memory media which perform the functionality of the present invention when the program code thereon is loaded into a processor or control unit. One such data carrier 80 with computer program code 81, in the form of a CD ROM disc, is schematically shown in FIG. 8. Data used by the above computer program may be accessed by means of any of: OPC, OPC servers, an Object Request Broker such as COM, DCOM or CORBA, a web service.

The embodiments illustrated and discussed in this specification are only intended to teach those skilled in the art the best way known to the inventors to make and use the invention. The person skilled in the art realizes that the present invention is by no means limited to the examples described. On the contrary, many modifications and variations to the switching device, system and method of use are possible within the scope of the appended claims.

The invention claimed is:

1. A switching device for disconnecting at least one electrical power load or an electric machine supplied with AC power from a power supply and controlled by a control unit, wherein a current sink and at least one mechanical switch in the switching device are arranged in a circuit between the power supply and at least one said electrical load, the current sink is arranged, upon receipt of a signal, to close and sink the current, and the at least one mechanical switch is arranged, on receipt of a signal, to open and disconnect the at least one said electrical load or electric machine when the current load is at or close to zero.

2. The switching device according to claim 1, wherein the current sink comprises any device from the group of: thyristor-based crowbar; diode bridge; diode bridge with active switch.

3. The switching device according to claim 2, wherein the current sink comprises at least one circuit comprising thyristors arranged with a ground point connection to a neutral point connection.

4. The switching device according to claim 1, the current sink is arranged connected closer to a potential source of fault current than the no-load switch.

5. The switching device according to claim 1, the current sink unit is connected to more than one mechanical switch.

6. The switching device according to claim 1, wherein the current sink and at least one mechanical switch in a switching device are arranged connected between a voltage source converter and at least one said electrical power load or electric machine.

7. The switching device according to claim 1, wherein at least one impedance device is arranged between the power supply and the switching device.

8. The switching device according to claim 1, wherein the control unit comprises a processor and a computer program adapted for sending out, upon receipt of a fault current signal, a signal to carry out a protection action.

9. The switching device according to claim 1, wherein the control unit comprises one or more circuits arranged, upon receipt of a detection of a fault current, to generate a signal for a protection action.

10. The switching device according to claim 1, wherein the switching device comprises one or more circuits, or a control unit, arranged, upon detection of an over-voltage, to automatically generate a signal for a protection action against the over-voltage which comprises any of: sending a close signal to the current sink; sending an open signal to at least one mechanical switch.

11. The switching device according to claim 1, wherein the at least one mechanical switch is arranged, on receipt of a signal, to open and disconnect the at least one electrical load or electric machine in the shortest possible time ($t_{fc}$) during which a fault current may flow.

12. The switching device according to claim 1, wherein the current sink is arranged connectable to one or more DC-capacitors such that, on connection of the mechanical switch and the load, the DC-capacitors are charged by the current sink for a part of the time that the current sink is closed.

13. A method for disconnecting at least one electrical power load or an electric machine supplied with AC power from a power supply and controlled by a control unit using at least one switching device, wherein the switching device comprises a current sink and at least one electric machine or load arranged in a circuit between the power supply and the electrical machine, and by switching, upon receipt of a signal, the current sink to close and sink the current, signalling at least one mechanical switch to open, and switching off the current sink when the mechanical switch has opened so that the mechanical switch has switched to disconnect the at least one said electrical load or electric machine when the current load is at or close to zero.

14. The method according to claim 13, wherein the current sink comprises any device from the group of: thyristor-based crowbar; diode bridge; and diode bridge with active switch.

15. The method according to claim 13, wherein the current sink comprises at least one circuit comprising thyristors arranged with a ground point connection to a neutral point connection, and by sinking the current including any zero sequence component.

16. The method according to claim 13, wherein the current sink unit is connected to more than one mechanical switch and by the further step of signalling a second mechanical switch to open.

17. The method according to claim 13, wherein the current sink and at least one mechanical switch in a switching device are arranged connected between a voltage source converter and at least one said electrical power load or electric machine wherein the current sink is arranged connected closer to a potential source of fault current than the no-load switch and by receiving a signal of a fault current or load switching event and triggering a protection step which comprises any from the group of: sending a close signal to the current sink; sending an open signal to at least one mechanical switch; and sending an open signal to the current sink.

18. The method according to claim 13, wherein at least one impedance device is arranged between the power supply and the switching device.

19. The method according to claim 13, comprising the steps of receiving a signal of a fault current and triggering a protection step which may comprise any from the group of: sending a close signal to current sink; and sending an open signal to a mechanical switch.

20. The method according to claim 13, comprising the steps of receiving a signal of an over-voltage and triggering a protection step which may comprise any from the group of: sending a close signal to current sink; and sending an open signal to a mechanical switch.

21. The method according to claim 13, wherein the switching device comprises one or more circuits, or a control unit arranged, upon detection of an over-voltage, to automatically generate a signal for a protection action against an over-voltage voltage which comprises any of: sending a close signal to the current sink; sending an open signal to at least one mechanical switch.

22. The method according to claim 13, wherein the at least one mechanical switch is arranged, on receipt of a signal to open and disconnect the at least one said electrical load or electric machine in the shortest possible time ($t_{fc}$) during which a fault current may flow.

23. The method according to claim 13, wherein the current sink is arranged connectable to one or more DC-capacitors and, on connection of the mechanical switch and the load by charging the DC-capacitors from the current sink for part of the time that the current sink is closed.

24. A computer program embodied on a non-transitory computer readable medium for controlling at least one electric machine or an electrical load supplied with AC power from a power supply and controlled by a control unit using at least one switching device, said program comprising software code portions or computer code to cause a computer or processor to carry out the steps of the method according to claim 13.

25. A computer program product for a switching device, the computer program product being recorded on a non-transitory computer readable medium, comprising computer program code or software code portions which when read into a computer or processor causes the computer or processor in a circuit of a control unit to cause the switching device to: switch, upon receipt of a signal, the current sink to close and sink the current; open, on receipt of a signal at least one mechanical switch; and switch off the current sink when the mechanical switch has opened so that the mechanical switch has switched to disconnect at least one electrical load or electric machine when the current load is at or close to zero.

26. A distribution system supplying AC power from a power supply to a plurality of electric power loads or electric machines, and comprising at least one switching device controlled by a control unit disconnecting at least one of the plurality of electrical loads or electric machines, wherein at least one mechanical switch and a current sink in the switching device are arranged in a circuit between the power supply and the electrical machine, the current sink is arranged, upon receipt of a signal, to close and sink the current, and the mechanical switch is arranged to open and break the current on receipt of a signal to open supplied to the electric machine when the current load is at or close to zero.

* * * * *